(12) United States Patent
Jang

(10) Patent No.: US 10,046,536 B2
(45) Date of Patent: Aug. 14, 2018

(54) COMPOSITE SHEET AND DISPLAY DEVICE INCLUDING THE SAME

(71) Applicant: Samsung Display Co., Ltd., Yongin, Gyeonggi-Do (KR)

(72) Inventor: Nam Jin Jang, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 559 days.

(21) Appl. No.: 14/672,018

(22) Filed: Mar. 27, 2015

(65) Prior Publication Data
US 2016/0055793 A1    Feb. 25, 2016

(30) Foreign Application Priority Data

Aug. 19, 2014  (KR) .................. 10-2014-0107794

(51) Int. Cl.
| | | |
|---|---|---|
| *B32B 3/26* | (2006.01) | |
| *B32B 9/00* | (2006.01) | |
| *B32B 3/30* | (2006.01) | |
| *B32B 5/18* | (2006.01) | |
| *B32B 7/12* | (2006.01) | |
| *B32B 15/04* | (2006.01) | |
| *H01L 23/367* | (2006.01) | |
| *H01L 23/373* | (2006.01) | |
| *B32B 9/04* | (2006.01) | |
| *B32B 15/20* | (2006.01) | |
| *B32B 27/40* | (2006.01) | |
| *B32B 3/08* | (2006.01) | |

(52) U.S. Cl.
CPC .............. *B32B 3/266* (2013.01); *B32B 3/08* (2013.01); *B32B 3/30* (2013.01); *B32B 5/18* (2013.01); *B32B 7/12* (2013.01); *B32B 9/007* (2013.01); *B32B 9/045* (2013.01); *B32B 9/046* (2013.01); *B32B 15/04* (2013.01); *B32B 15/20* (2013.01); *B32B 27/40* (2013.01); *H01L 23/367* (2013.01); *H01L 23/3735* (2013.01); *B32B 2264/108* (2013.01); *B32B 2307/202* (2013.01); *B32B 2307/302* (2013.01); *B32B 2307/51* (2013.01); *B32B 2307/56* (2013.01); *B32B 2457/20* (2013.01)

(58) Field of Classification Search
CPC . H01L 23/367; H01L 23/373; H01L 23/3735; H01L 23/3736; H05K 7/2039; H05K 7/20954; H05K 7/20963; Y10T 428/24802
See application file for complete search history.

(56) References Cited

U.S. PATENT DOCUMENTS

| | | | | |
|---|---|---|---|---|
| 7,495,918 B2 * | 2/2009 | Lee | ................. | H05K 7/20963 165/104.33 |
| 2008/0019097 A1 * | 1/2008 | Zhang | ................. | F28F 13/00 361/704 |
| 2010/0321897 A1 * | 12/2010 | Hill | ................. | B29C 66/304 361/720 |

FOREIGN PATENT DOCUMENTS

| | | |
|---|---|---|
| JP | 2003-92384 A | 3/2003 |
| KR | 10-0554097 B1 | 2/2006 |
| KR | 10-2013-0087987 A | 8/2013 |

* cited by examiner

*Primary Examiner* — Gerard Higgins
(74) *Attorney, Agent, or Firm* — Lewis Roca Rothgerber Christie LLP

(57) ABSTRACT

According to an embodiment of the present invention, a composite sheet includes a shock mitigating layer including an elastic member and a graphite layer accommodated in the elastic member, a first heat dissipation sheet configured to be attached to one surface of the shock mitigating layer, and a second heat dissipation sheet configured to be attached to another surface of the shock mitigating layer.

17 Claims, 14 Drawing Sheets

COMPOSITE SHEET AND DISPLAY DEVICE INCLUDING THE SAME

CROSS-REFERENCE TO RELATED APPLICATION

This application claims priority to and the benefit of Korean Patent Application No. 10-2014-0107794 filed on Aug. 19, 2014 in the Korean Intellectual Property Office, the entire content of which is incorporated herein by reference.

BACKGROUND

1. Field

The invention relates to a composite sheet and a display device including the same.

2. Description of the Related Art

The importance of flat panel displays (FPDs) has steadily grown with recent developments in multimedia technology. As a result, a variety of FPDs such as a liquid crystal display (LCD), a plasma display panel (PDP), a field emission display (FED), and an organic light-emitting display device have been commercialized.

Organic light-emitting display devices, among other FPDs, are increasingly replacing LCDs, which have been widespread. Organic light-emitting display devices, unlike LCDs, display images by generating light themselves, and thus, do not require backlight units that can generate light. Thus, organic light-emitting display devices are more suitable than LCDs for the fabrication of thin display devices. Also, organic light-emitting display devices have excellent response properties. Due to these and other benefits, the usage of organic light-emitting display devices as next-generation display devices is increasingly expanding.

An organic light-emitting display device includes an organic light-emitting diode (OLED) having a light-emitting layer. Since the light-emitting layer is formed of an organic material that is susceptible to heat, however, deterioration of the light-emitting layer may easily be caused by heat generated by a display panel and a driving circuit board. Accordingly, it is beneficial to dissipate heat generated inside the organic light-emitting display device.

Therefore, research is being conducted into ways to efficiently dissipate heat generated from the inside of an organic light-emitting display device so as to prevent or reduce the deterioration of an organic material inside the organic light-emitting display device.

SUMMARY

Exemplary embodiments of the invention are directed toward a composite sheet capable of efficiently dissipating heat generated from the inside of an organic light-emitting display device, and a display device including the composite sheet.

Exemplary embodiments of the invention are also directed toward a composite sheet capable of efficiently dissipating heat generated from the inside of an organic light-emitting display device while maintaining its thinness, and a display device including the composite sheet.

Exemplary embodiments of the invention are also directed toward a composite sheet capable of providing excellent rigidity while maintaining its thinness and a display device including the composite sheet.

Exemplary embodiments of the invention, however, are not restricted to those set forth herein. The above and other exemplary embodiments of the invention will become more apparent to one of ordinary skill in the art to which the invention pertains by referencing the detailed description of the invention given below.

According to an exemplary embodiment of the invention, a composite sheet includes a shock mitigating layer including an elastic member and a graphite layer accommodated in the elastic member, a first heat dissipation sheet configured to be attached to one surface of the shock mitigating layer, and a second heat dissipation sheet configured to be attached to another surface of the shock mitigating layer.

In another embodiment of the present invention, a display device includes a display panel, and a composite sheet configured to be attached to a surface of the display panel, wherein the composite sheet includes a shock mitigating layer including an elastic member and a graphite layer accommodated in the elastic member, a first heat dissipation sheet attached to one surface of the shock mitigating layer, and a second heat dissipation sheet attached to another surface of the shock mitigating layer.

Exemplary embodiments of the present disclosure provide a composite sheet capable of efficiently dissipating heat generated from the inside of an organic light-emitting display device, and a display device including the composite sheet.

Also, embodiments of the present disclosure are directed toward a composite sheet capable of performing an excellent heat dissipation function and providing excellent rigidity, and a display device including the composite sheet.

Other features and exemplary embodiments will be apparent from the following detailed description, the drawings, and the claims.

BRIEF DESCRIPTION OF THE DRAWINGS

The accompanying drawings, together with the specification, illustrate embodiments of the present invention, and, together with the description, serve to explain the principles of the present invention.

FIG. 1 is an exploded perspective view of a composite sheet according to an exemplary embodiment of the invention.

DETAILED DESCRIPTION

Figure 2:
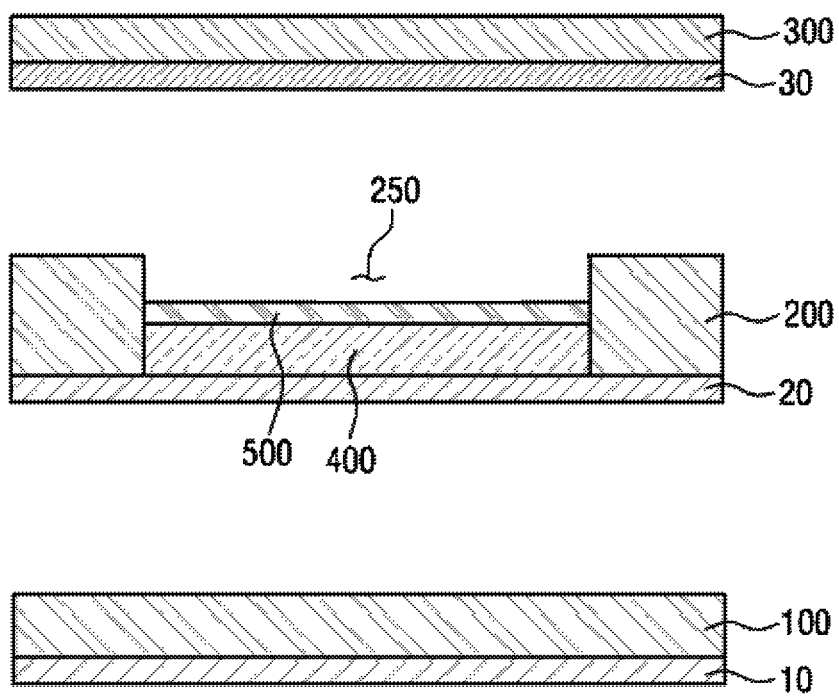
FIG. 2 is an exploded cross-sectional view of the composite sheet of FIG. 1, taken along line A-A' of FIG. 1.

Aspects and features of embodiments of the present invention and methods for achieving the aspects and features will be apparent by referring to the embodiments described herein with reference to the accompanying drawings. However, the present invention is not limited to the embodiments disclosed herein, but can be implemented in many diverse forms. The matters defined in the description, such as the detailed construction and elements, are provided to assist those of ordinary skill in the art in achieving a comprehensive understanding of the invention, and are not intended to limit the present invention, which is intended to cover various modifications and equivalent arrangements included within the spirit and scope of the appended claims, and equivalents thereof. In the present description, like reference numerals are used to designate like elements across various figures. In the drawings, sizes and relative sizes of layers and areas may be exaggerated for clarity of explanation.

In the context of the present application, the term "on" that is used to designate that an element is on another element on a different layer or a layer includes both a case where the element is directly on the other element or the layer and a case where the element is indirectly on the other element via another layer or still another element.

Although the terms "first, second, and so forth" are used to describe diverse constituent elements, such constituent elements are not limited by such terms. Those terms are used only to differentiate a constituent element from another constituent element. Accordingly, in the following description, a first constituent element may be a second constituent element, and vice versa.

Hereinafter, embodiments of the present invention will be described with reference to the accompanying drawings.

Figure 1:
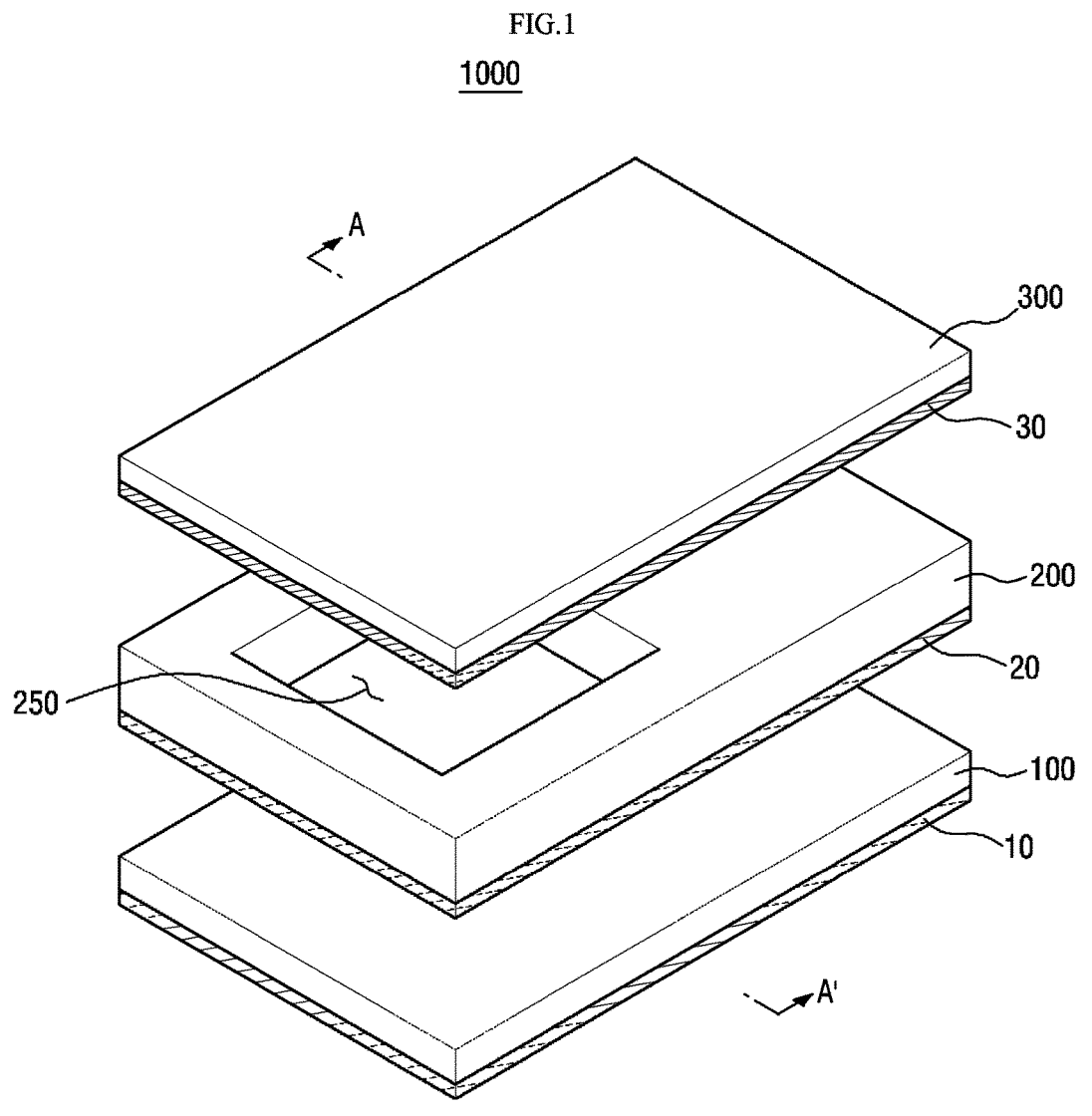
Figure 3:
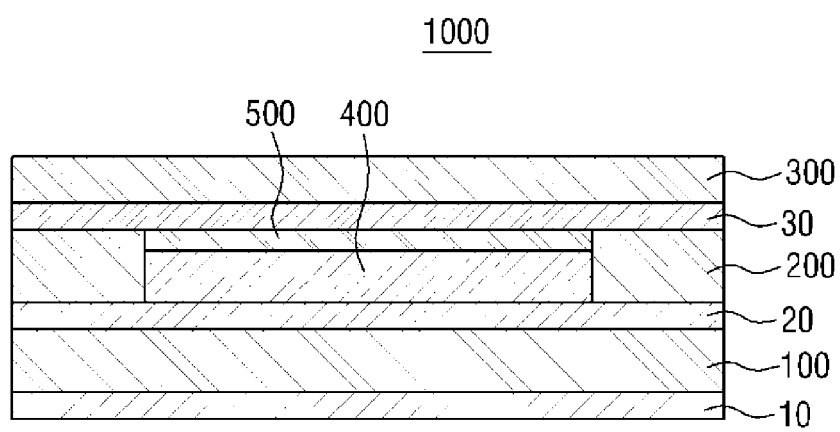
FIG. 3 is an assembled cross-sectional view of the composite sheet of FIG. 1.

FIG. 1 is an exploded perspective view of a composite sheet according to an exemplary embodiment of the invention, FIG. 2 is an exploded cross-sectional view of the composite sheet of FIG. 1, taken along line A-A' of FIG. 1, and FIG. 3 is an assembled cross-sectional view of the composite sheet of FIG. 1.

Referring to FIGS. 1 to 3, a composite sheet 1000 may include a shock mitigating layer including an elastic member 200 and a graphite layer 400 that is included in or formed in the elastic member 200, a first heat dissipation sheet attached to or onto one surface of the shock mitigating layer, and a second heat dissipation sheet 100 attached to or onto another surface of the shock mitigating layer. As shown in FIGS. 1 to 3, the graphite layer 400 may be accommodated in the elastic member 200. In some embodiments, the elastic member 200 may at least partially surround the graphite layer 400.

The elastic member 200 may include or be formed of an elastic material, for example, polyurethane (PU), and may absorb shock from the outside or the inside of a display device to which the composite sheet 1000 is applied. Accordingly, due to the elastic member 200, the durability of the display device may be improved. However, the material of the elastic member 200 is not limited to PU. For example, the material of the elastic member 200 may be suitably or appropriately selected from among a variety of suitable elastic materials other than PU that are available in the art.

The graphite layer 400 may include carbon powder, and may thus improve the thermal conductivity of the composite sheet 1000. Accordingly, the heat transfer rate of the composite sheet 1000 may be improved, and as a result, heat generated from the inside of the display device may be transmitted toward the first heat dissipation sheet 300 via the second heat dissipation sheet 100 and may be eventually discharged.

The elastic member 200 may further include a receiving aperture 250 that receives the graphite layer 400 therein. Because the graphite layer 400 may include carbon powder, as already mentioned above, the carbon powder may leak if it is not suitably accommodated. However, since the graphite layer 400 is accommodated in the receiving aperture 250 of the elastic member 200, the graphite layer 400 may be sealed, and as a result, the carbon powder in the graphite layer 400 may be prevented from leaking out of the display device (or a likelihood or amount of such leakage may be reduced).

The elastic member 200 not only prevents the display device from being damaged or broken due to impact from the inside or the outside of the display device (or reduces a likelihood or amount of such damage), but also receives the graphite layer 400 therein. For example, by using a single or sole layer, e.g., the elastic member 200, two functions, e.g., improving the durability of the display device and accommodating the graphite layer 400, may be performed. Accordingly, the thickness of the composite sheet 1000 may be reduced (e.g., by including the graphite layer 400 in the elastic member 200).

The receiving aperture 250 may be at, on or formed on one side of the shock mitigating layer. For example, the receiving aperture 250 may be on or disposed on a left side of the elastic member 200 in a horizontal cross-sectional view, as illustrated in FIG. 1, to correspond to a driving region of a display panel of the display device when the composite sheet 1000 is attached to or onto the display panel of the display device.

For example, heat may be generated by a driving unit in the driving region of the display device, and as a result, more heat may be generated in the driving region than in the rest of the display device, thereby increasing the amount of heat to be dissipated (or increasing the necessity of heat dissipation) in the driving region. Accordingly, in some embodiments, the receiving aperture 250 of the composite sheet 1000 is provided in a region where there is more heat to be dissipated (or where heat dissipation is more needed) than anywhere else in the display device, and the graphite layer 400 is accommodated in the receiving aperture 250. Therefore, the area of the graphite layer 400 may be reduced. As a result, the manufacturing cost of the graphite layer 400 may be lowered by reducing an amount of carbon powder or an amount of unnecessary carbon powder used. For example, the amount of carbon powder used may be reduced by including the carbon powder in the driving region and not including the carbon powder in a non-driving region.

The location of the receiving aperture 250 may be changed or may vary depending on where the most heat is generated in the display device. More than one receiving aperture 250 may be provided, in which case, the size and arrangement of the receiving apertures 250 may be changed or may vary and as many graphite layers 400 as there are receiving apertures 250 may be provided to be inserted into or accommodated in the receiving apertures 250, respectively.

The receiving aperture 250 may have a rectangular shape in a horizontal cross-sectional view, but the invention is not limited thereto. For example, the receiving aperture 250 may have or be formed in various suitable horizontal cross-sectional shapes other than a rectangular shape.

The composite sheet 1000 may also include a cover layer 500 that is on or formed on the graphite layer 400 and is accommodated or received in the receiving aperture 250. As already mentioned above, the graphite layer 400, which is provided in the elastic member 200, may be easily leaked out of the elastic member 200 in the form of powder if the graphite layer is not suitably accommodated in the elastic member 200. The cover layer 500 may effectively prevent the carbon powder in the graphite layer 400 from leaking out of the elastic member 200 (or the cover layer 500 may reduce a likelihood or amount of such leakage). Also, the cover layer 500 may prevent the carbon powder in the graphite layer 400 from contacting a first adhesive layer 30 (or the cover layer 500 may reduce a likelihood or amount of such contact), which would otherwise weaken the adhesion of the first adhesive layer 30. The first adhesive layer 30 is described in more detail below.

At least one selected from the first heat dissipation sheet 300 and the second heat dissipation sheet 100 may include a metallic material. For example, at least one selected from the first heat dissipation sheet 300 and the second heat dissipation sheet 100 may be formed as or include a thin copper sheet, but the invention is not limited thereto. For example, the material of the first heat dissipation sheet 300 and/or the second heat dissipation sheet 100 may be appropriately selected from suitable materials other than copper that are available in the art. Since the metallic material generally has excellent thermal conductivity, the heat transfer rate of the composite sheet 1000 may be improved by forming at least one selected from the first heat dissipation sheet 300 and the second heat dissipation sheet 100 to include the metallic material. As a result, heat generated from the inside of the display device may be effectively discharged, and thus, the heat release rate of the composite sheet 1000 may be improved.

The first heat dissipation sheet 300, the shock mitigating layer and the second heat dissipation sheet 100 may be bonded together to form the composite sheet 1000. For this, the composite sheet 1000 may also include the first adhesive layer 30 interposed between the first heat dissipation sheet 300 and the shock mitigating layer, and a second adhesive layer 20 interposed between the second heat dissipation sheet 100 and the shock mitigating layer, but the present invention is not limited thereto.

At least one selected from the first adhesive layer 30 and the second adhesive layer 20 may include a conductive adhesive. Since the conductive adhesive has excellent thermal conductivity, the conductive adhesive may improve the heat transfer rate of the composite sheet 1000. As a result, the release of heat from the display device may be facilitated or improved, and the heat dissipation efficiency of the composite sheet 1000 may be improved. However, the material of at least one selected from the first adhesive layer 30 and the second adhesive layer 20 is not limited to the conductive adhesive. For example, the material of at least one selected from the first adhesive layer 30 and the second adhesive layer 20 may be appropriately selected from among a variety of suitable adhesives having a high thermal transfer rate, other than the conductive adhesive.

The conductive adhesive may be any suitable conductive adhesive available in the field to which the invention pertains, and thus, a further description thereof is not necessary here.

The composite sheet 1000 may also include a third adhesive layer 10 that is on or formed on a surface of the second heat dissipation sheet 100 where the second adhesive layer 20 is not formed (e.g., on a surface of the second heat dissipation sheet 10 facing away from a surface of the second heat dissipation sheet 10 on which the second adhesive layer 20 is located). For example, the third adhesive layer 10 may be provided on an outermost surface of the composite sheet 1000, e.g., a bottom surface of the second heat dissipation sheet 100, in order for the composite sheet 1000 to be attached to or onto the display panel of the display device, which will be described later in more detail. The third adhesive layer 10 may include a conductive adhesive or another adhesive having excellent thermal conductivity. For example, the third adhesive layer 10 may include or be formed of the same or substantially the same material as the first adhesive layer 30 and/or the second adhesive layer 20, and thus, a further description of the material of the third adhesive layer 10 is not necessary here.

The graphite layer 400 may be interposed between the cover layer 500 and the second adhesive layer 20, and may be sealed inside the elastic member 200. For example, the second adhesive layer 20 may be on or formed on a surface of the elastic member 200 where the second heat dissipation sheet 100 is located or formed, and may have an area corresponding to, equal to, or substantially equal to an area of the second heat dissipation sheet 100. The elastic member 200 includes the receiving aperture 250, and thus has empty space therein for accommodating the graphite layer 400. Accordingly, the second adhesive layer 20 may be exposed at a side of the receiving aperture 250 facing the second heat dissipation layer 100.

Therefore, the graphite layer 400, which is received in the receiving aperture 250 of the elastic member 200, may be sealed between the second adhesive layer 20 and the cover layer 500. The graphite layer 400 and the cover layer 500 will be described later in more detail with reference to FIGS. 8 and 9.

The elastic member 200, which is included in or forms the shock mitigating layer, may include or be a foam-type molded product (e.g., a molded product including a foam material). The foam material may include any foam material suitable for absorbing, blunting, reducing or mitigating an impact, for example, a polyurethane foam. In response to the elastic member 200 being formed as a foam-type molded product (e.g., a molded product including a foam material), an impact from the outside of the display device may be absorbed by or within the elastic member 200.

In a case in which the elastic member 200 is formed as a foam-type molded product (e.g., a molded product including a foam material), the elastic member 200 may be formed to be higher than the graphite layer 400 and the cover layer 500, as illustrated in FIG. 2 (e.g., a thickness of the elastic member 200 may be greater than a combined thickness of the graphite layer 400 and the cover layer 500). Then, in response to the fabrication of the composite sheet 1000 being completed by bonding the first heat dissipation sheet 300, the shock mitigating layer and the second heat dissipation sheet 100 together, the elastic member 200 may be compressed to have the same or substantially the same height as the graphite layer 400 and the cover layer 500, as illustrated in FIG. 3 (e.g., the elastic member 200 may be compressed to have a thickness equal to or substantially equal to the combined thickness of the graphite layer 400 and the cover layer 500).

Figure 4:
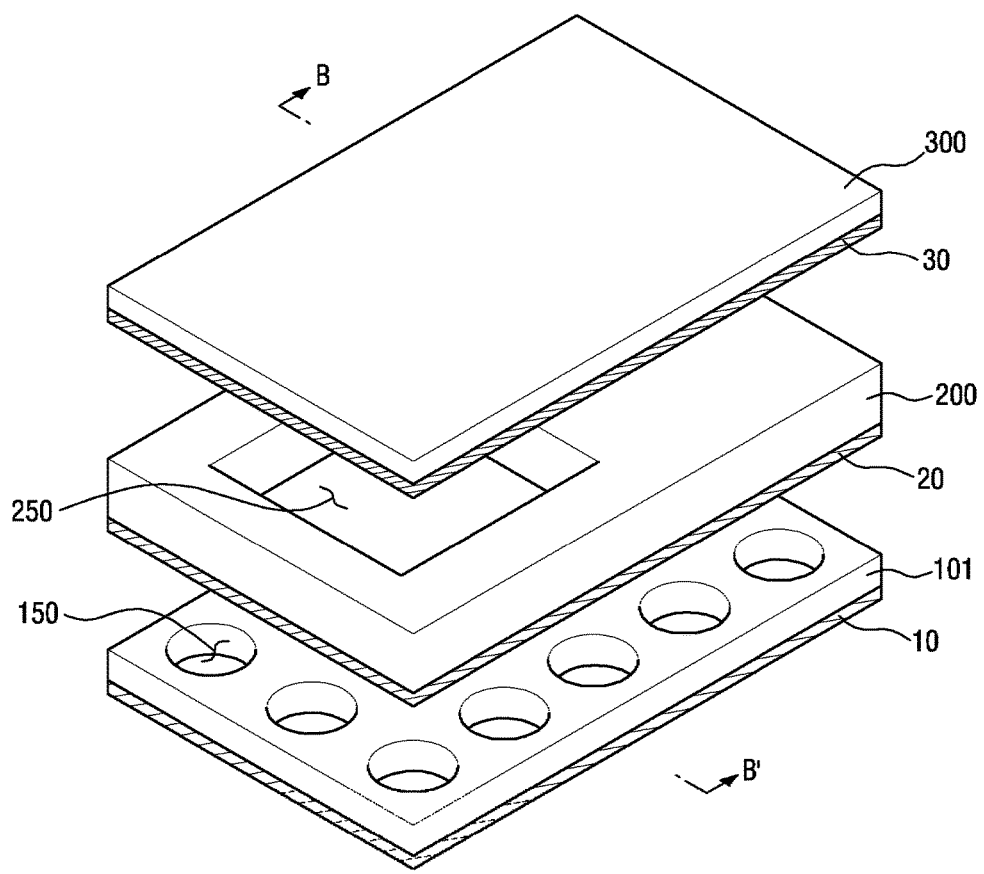
FIG. 4 is an exploded perspective view of a composite sheet according to another exemplary embodiment of the invention.
Figure 5:
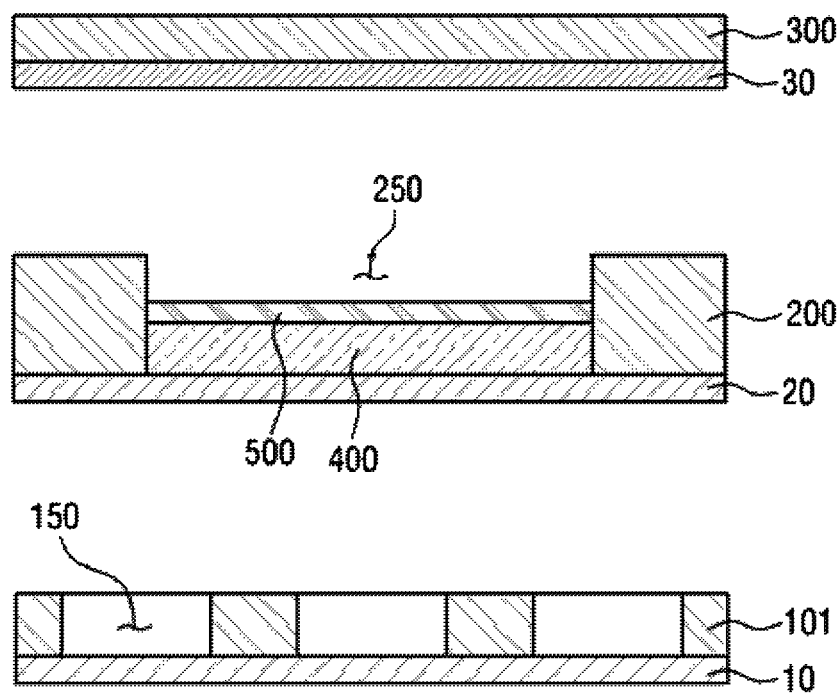
FIG. 5 is an exploded cross-sectional view of the composite sheet of FIG. 4, taken along line B-B' of FIG. 4.
Figure 6:
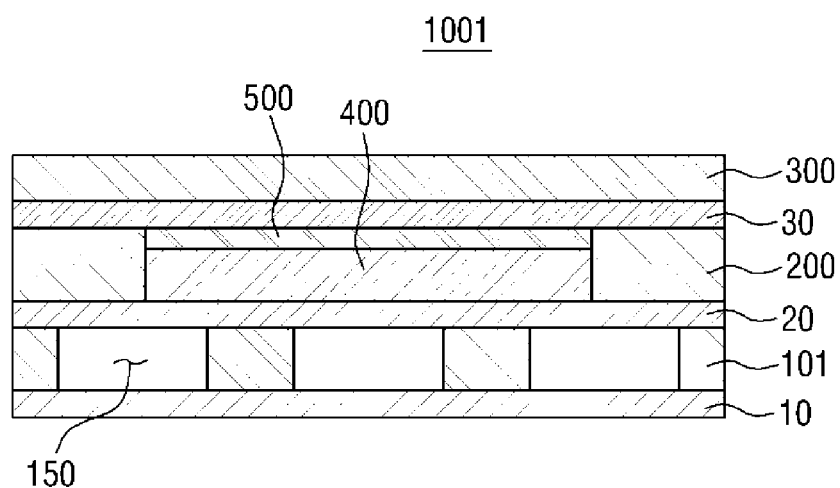
FIG. 6 is an assembled cross-sectional view of the composite sheet of FIG. 4.

FIG. 4 is an exploded perspective view of a composite sheet according to another exemplary embodiment of the invention, FIG. 5 is an exploded cross-sectional view of the composite sheet of FIG. 4, taken along line B-B' of FIG. 4, and FIG. 6 is an assembled cross-sectional view of the composite sheet of FIG. 4.

Referring to FIGS. 4 to 6, a composite sheet 1001 may include a second heat dissipation sheet 101, and the second heat dissipation sheet 101 may include one or more perforations 150. For example, as illustrated in FIG. 4, a plurality of perforations 150 may be at, on, or formed on the second heat dissipation sheet 101, and may be regularly arranged, but the perforations 150 are not limited thereto. For example, the arrangement of the perforations 150 is not limited to that set forth in FIG. 4. Instead, the arrangement of the perforations 150 may be changed or may vary.

In a case when the second heat dissipation sheet 101 includes the perforations 150, bubbles that may be generated inside a third adhesive layer 10 that is on or formed on the second heat dissipation sheet 101, may be released from the third adhesive layer 10. Accordingly, the composite sheet 1001 may be prevented from being distorted due to the bubbles when attached to or onto a display panel with the use of the third adhesive layer 30 (or an a likelihood or amount of such distortion may be reduced).

The perforations 150 will be described later in further detail.

Figure 7:
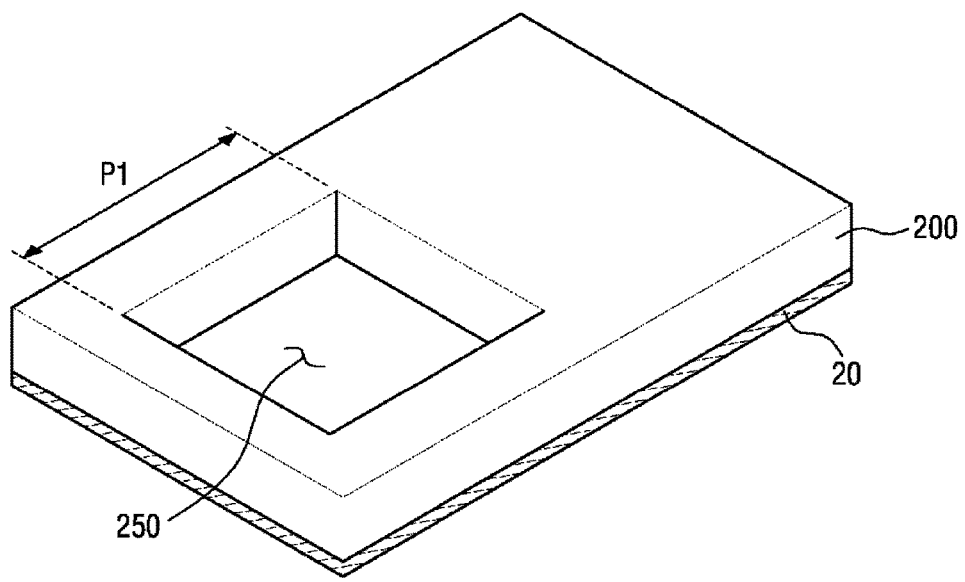
FIG. 7 is a perspective view of an elastic member and a second adhesive layer according to an exemplary embodiment of the invention
Figure 8:
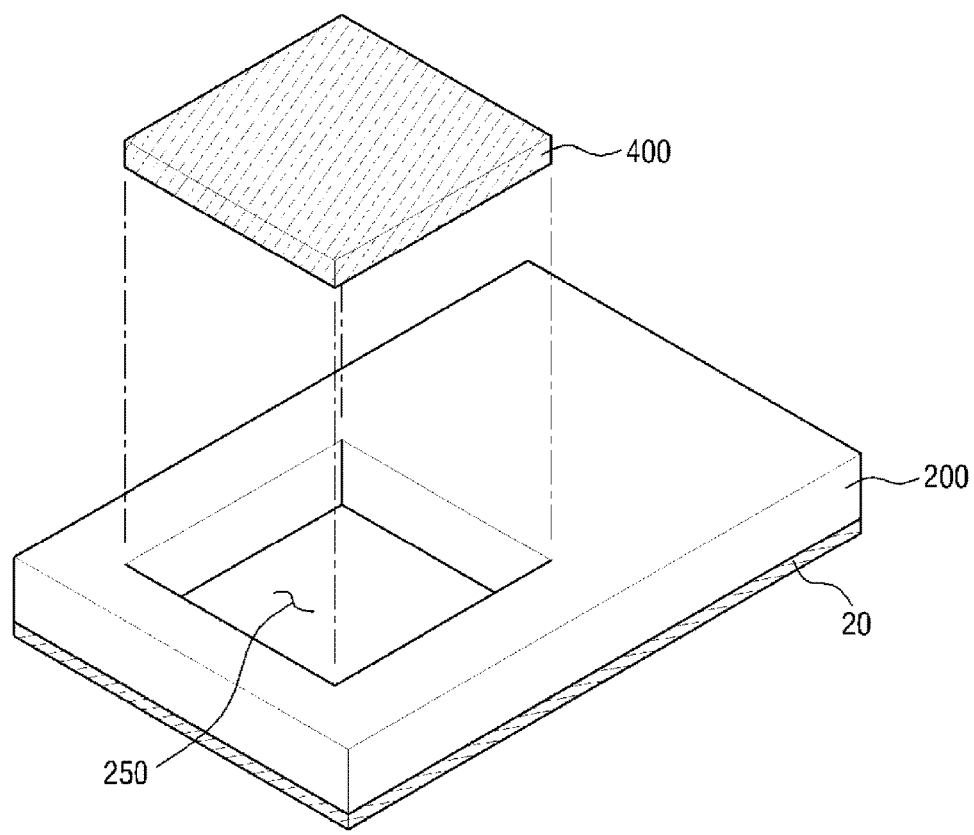
FIGS. 8 and 9 are perspective views illustrating a process of assembling a graphite layer and a cover layer onto a shock mitigating layer
Figure 9:
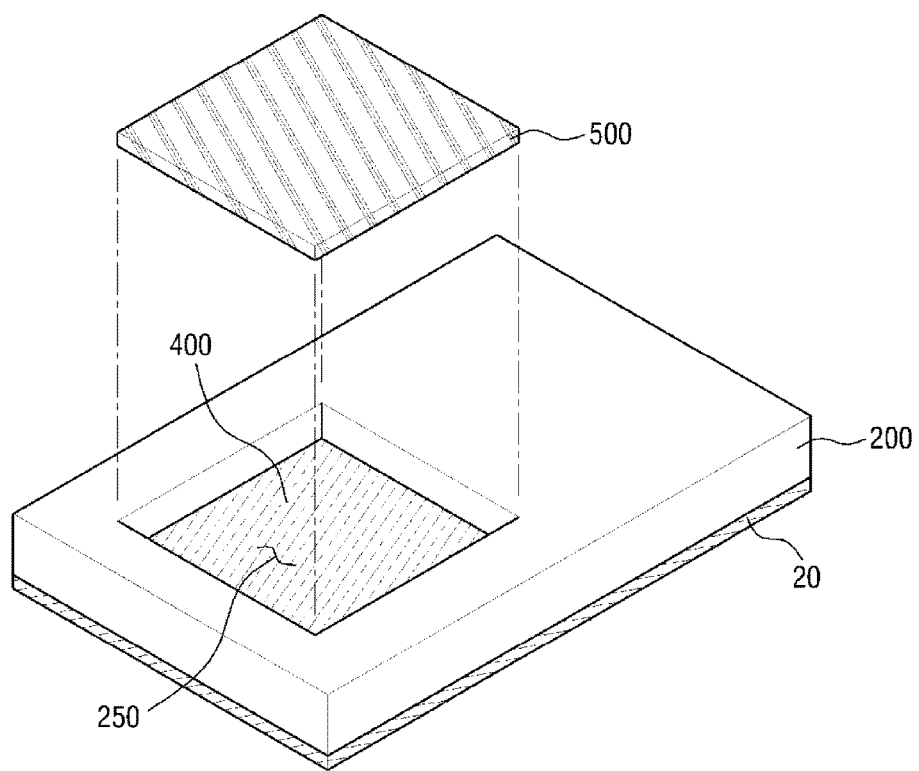

FIG. 7 is a perspective view of the elastic member 200 and the second adhesive layer 20, and FIGS. 8 and 9 are perspective views illustrating an embodiment of a process of assembling the graphite layer 400 and the cover layer 500 into the receiving aperture 200 of the elastic member 200.

Referring to FIG. 7, the second adhesive layer 20 may be on or formed on a bottom surface of the elastic member 200. The elastic member 200 may include the receiving aperture 250, and a portion or part of the second adhesive layer 20 may be exposed at the bottom of the receiving aperture 250.

Referring to FIG. 8, the graphite layer 400, which has substantially the same shape as the receiving aperture 250 in a horizontal cross-sectional view, may be received and inserted in the receiving aperture 250. The thickness of the graphite layer 400 may be the same as or smaller (e.g., thinner) than a depth of the receiving aperture 250, but the invention is not limited thereto. In response to the graphite layer 400 being inserted into the receiving aperture 250, the graphite layer 400 may be isolated from the outside of the elastic member 200 due to the presence of the second adhesive layer 20 at the bottom of the receiving aperture 250. Accordingly, the carbon powder in the graphite layer 400 may be prevented from leaking through the bottom of the elastic member 200 (or a likelihood or amount of such leakage may be reduced). Also, the graphite layer 400 may be fixed by the second adhesive layer 20 at the bottom of the elastic member 200.

In a case in which the thickness of the graphite layer 400 is smaller than the depth of the receiving aperture 250, an empty space may be provided above the graphite layer 400 after the insertion of the graphite layer 400 into the receiving aperture 250 of the elastic member 200. The cover layer 500 may be inserted into the empty space above the graphite layer 400 inside the receiving aperture 250 of the elastic member 200, as illustrated in FIG. 9.

The cover layer 500 may be formed to correspond to the shape of the receiving aperture 250 and/or the shape of the graphite layer 400 in a horizontal cross-sectional view. For example, the cover layer 500 may be formed to have substantially the same horizontal cross-sectional shape as the receiving aperture 250 and/or the graphite layer 400, but the invention is not limited thereto. For example, the cover layer 500 may be formed to be larger than the receiving aperture 250 in a horizontal cross-sectional view, and may thus fully cover the opening at the top of the receiving aperture 250.

In response to the horizontal cross-section of the cover layer 500 being included in the horizontal cross-section of the receiving aperture 250, the cover layer 500 may be inserted into the receiving aperture 250 to cover the top of the graphite layer 400. In a case when the cover layer 500 is inserted into the receiving aperture 250, the combined height or thickness of the graphite layer 400 and the cover layer 500 may be the same as or smaller (e.g., thinner) than the height or thickness of the elastic member 200. As already mentioned above, however, the elastic member 200 may be compressed when attached to or onto the first heat dissipation sheet 300, and as a result, the height or thickness of the elastic member 200 may become substantially the same as the combined height or thickness of the graphite layer 400 and the cover layer 500. The invention, however, is not limited to this embodiment. For example, the thicknesses and the cross-sectional shapes of the elastic member 200, the graphite layer 400 and the cover layer 500 may be changed or may vary.

In a case in which the graphite layer 400 is covered or formed to be covered by the cover layer 500, a bottom surface of the graphite layer 400 may be covered by the second adhesive layer 20 at the bottom of the receiving aperture 250 of the elastic member 200, and a top surface of the graphite layer 400 may be covered by the cover layer 500. As a result, the carbon powder in the graphite layer 400 may be prevented from leaking out of the elastic member 200 (or a likelihood or amount of such leakage may be reduced).

Also, since the first adhesive layer 30 and the first heat dissipation sheet 300 may be provided at a top of the elastic member 200 and the second heat dissipation sheet 100 may be provided at a bottom of the elastic member 200, the carbon powder in the graphite layer 400 may be further prevented from leaking (or a likelihood or amount of such leakage may be further reduced).

Figure 10:
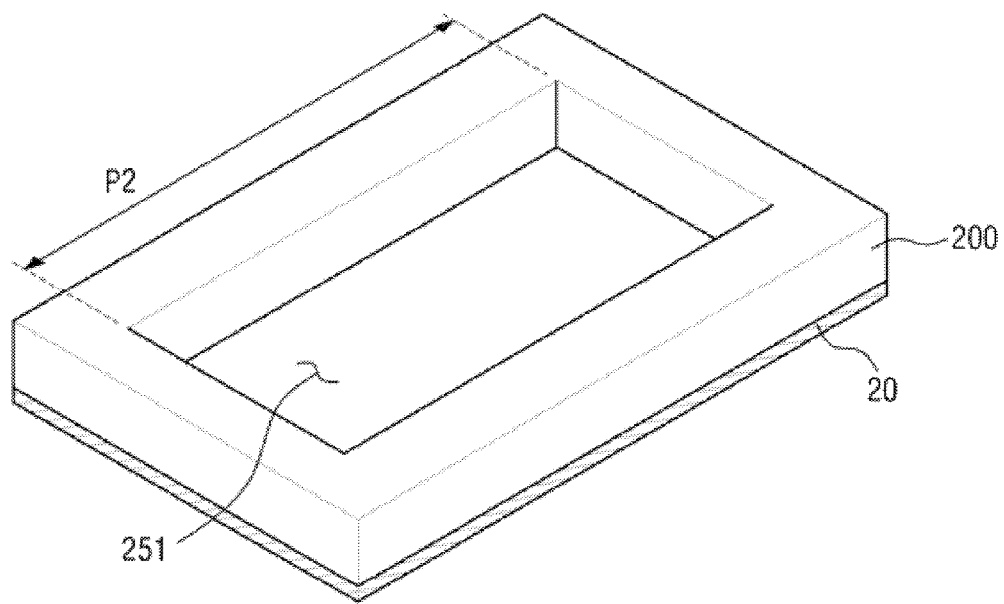
FIG. 10 is a perspective view of an elastic member according to another exemplary embodiment of the invention

FIG. 10 is a perspective view of an elastic member according to another exemplary embodiment of the invention. Referring to FIG. 10, a receiving aperture 251 may be symmetrically at, on, or formed on an elastic member 200 (e.g., to be in symmetry with the elastic member 200) and to have a width P2, whereas in the exemplary embodiment of FIG. 7, the receiving aperture 250 may be at, on, or formed on a side of the elastic member 200 to have a width P1 that is smaller than the width P2. In the exemplary embodiment of FIG. 10, a graphite layer, which is to be inserted into the receiving aperture 251, may have or be formed to have a shape corresponding to the shape of the receiving aperture 251.

Figure 11:
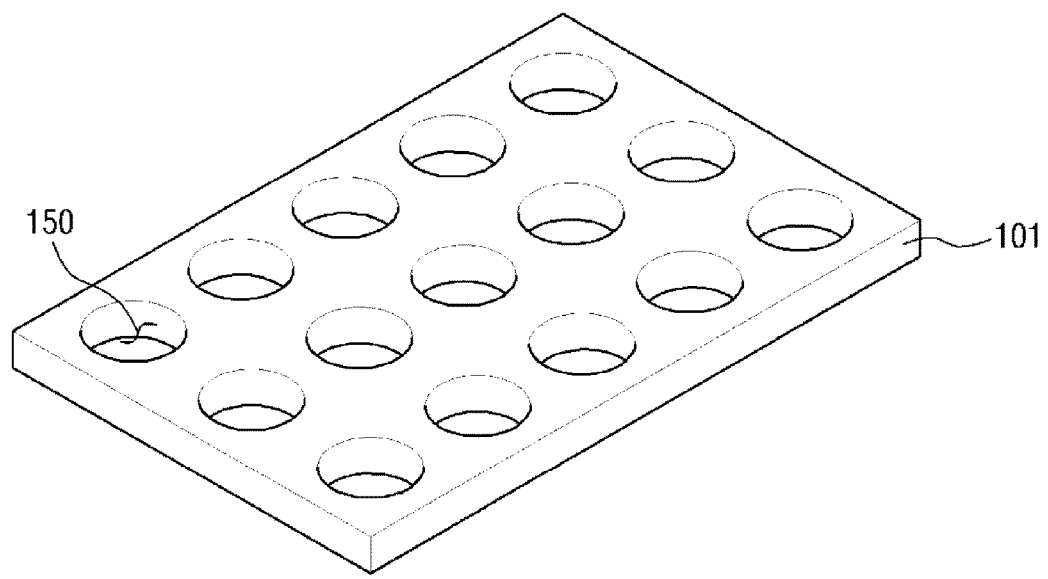
FIG. 11 is a perspective view of a second heat dissipation sheet according to an exemplary embodiment of the invention
Figure 12:
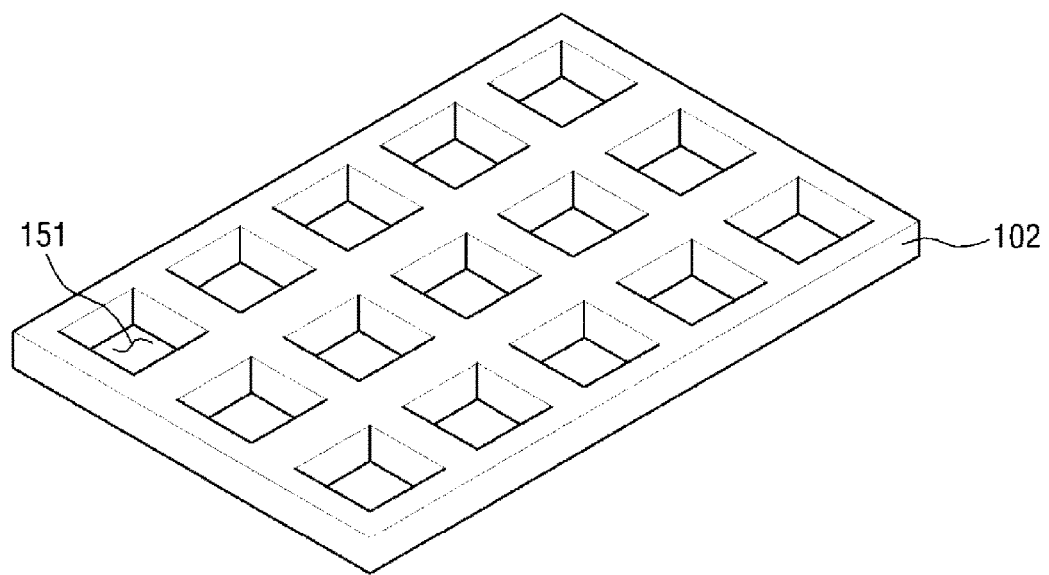
FIG. 12 is a perspective view of a second heat dissipation sheet according to another exemplary embodiment of the invention

FIG. 11 is a perspective view of a second heat dissipation sheet according to an exemplary embodiment of the invention, and FIG. 12 is a perspective view of a second heat dissipation sheet according to another exemplary embodiment of the invention.

Referring to FIGS. 11 and 12, a plurality of perforations 150 may be at, on, or formed on a second heat dissipation sheet 101. As already mentioned above, the perforations 150 may allow bubbles that may be generated in a third adhesive layer 10 to be released from the third adhesive layer 10 and may thus help a composite sheet be adequately attached to or onto a display panel.

Figure 13:
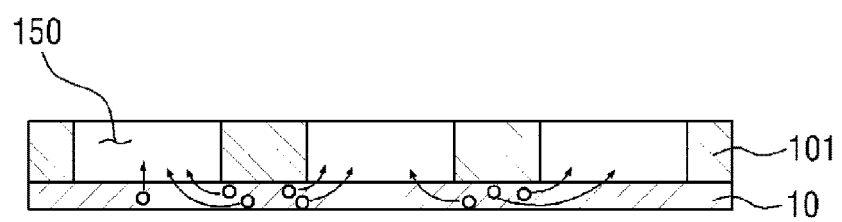
FIG. 13 is a perspective view illustrating the release of bubbles through perforations of the second heat dissipation sheet of FIG. 11.

FIG. 13 is a perspective view illustrating the release of bubbles through the perforations 150 of the second heat dissipation sheet 101. Referring to FIG. 13, bubbles in or formed by the third adhesive layer 10 may be released from the third adhesive layer 10 into the perforations 150 and then to the outside of the second heat dissipation sheet 101.

Referring back to FIG. 11, one or more perforations 150 may be formed to be circular in a cross-sectional view, and may be regularly arranged on the second heat dissipation sheet 101. Alternatively, a plurality of perforations 151 may be formed to be rectangular in a cross-sectional view, and may be regularly arranged on a second heat dissipation sheet 102. The shape and the arrangement of the perforations 150 or 151, however, are not limited to those set forth in FIGS. 11 and 12. For example, the perforations 150 or 151 may be irregularly or randomly arranged, may be densely populated in a certain area (e.g., inhomogeneously distributed) or may have different horizontal cross-sectional shapes from one another (e.g., the perforations 150 or 151 may have a plurality of cross-sectional shapes).

In addition to, or instead of, the second heat dissipation sheet 101, the first heat dissipation sheet 300 may also include or be formed to include one or more perforations. In this case, bubbles in the first adhesive layer 30, which is attached to or onto the first heat dissipation sheet 300, may be released through the perforations of the first adhesive sheet 300. The perforations of the first heat dissipation sheet 300 serve substantially the same functions as the perforations 150 or 151, and thus, a further description thereof is not necessary here.

Figure 14:
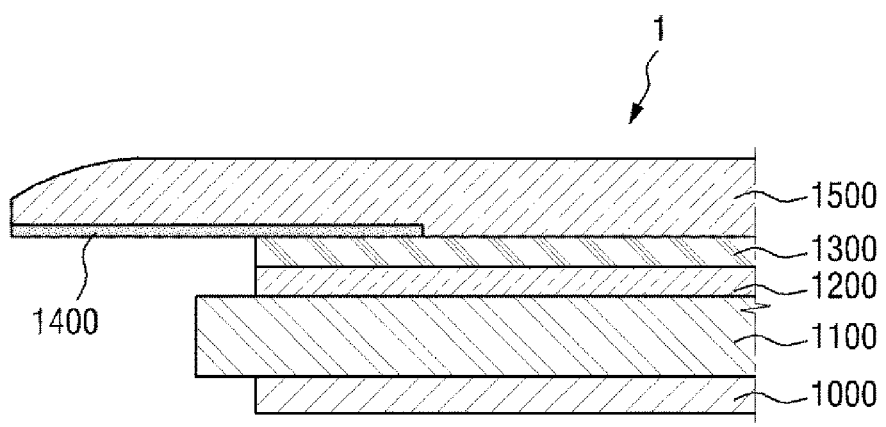
FIG. 14 is a cross-sectional view of a display device according to an exemplary embodiment of the invention.

FIG. 14 is a cross-sectional view of a display device according to an exemplary embodiment of the invention.

Referring to FIG. 14, a display device 1 may include a display panel 1100 and a composite sheet 1000 that is attached to or onto one surface of the display panel 1100. The composite sheet 1000 may include a shock mitigating layer having an elastic member and a graphite layer accommodated in the elastic member (e.g., a graphite layer that is formed in the elastic member), a first heat dissipation sheet attached to or onto one surface of the shock mitigating layer, and a second heat dissipation sheet attached to or onto another surface of the shock mitigating layer. In FIG. 14, the display device 1 further includes a polarizer plate 1200 on the display panel 1100, an adhesive layer 1300 on the polarizer plate 1200, a cover window 1500 (e.g., a transparent glass or plastic substrate) on the adhesive layer 1300, and a black matrix 1400 between the cover window 1500 and the adhesive layer 1300.

The composite sheet 1000 has already been described above, and thus, a further description thereof is not necessary here.

The display panel 1100 may include an organic light-emitting device, and may display a suitable or desired image based on light emitted from the organic light-emitting device with the aid of other elements of the display device 1. The organic light-emitting device may be any suitable organic light-emitting device available in the field to which the invention pertains, and thus, a further description thereof is not necessary here.

The display panel 1100 may include a driving region in which a driving unit for driving the display panel 1100 is provided, and a receiving aperture may be formed in the shock mitigating layer to overlap with the driving region of the display panel 1100.

The driving unit in the driving region may generate a substantial or considerable amount of heat while processing information. In an exemplary embodiment, the graphite layer may be at, in, or formed in a region of the composite sheet 1000 corresponding to a region of the display device 1 where too much heat or a set amount of heat is generated. In this exemplary embodiment, heat dissipation may be efficiently performed, and a waste of graphite may be prevented or reduced. However, the invention is not limited to this exemplary embodiment. For example, the graphite layer may be formed to be uniformly distributed in the elastic member.

The composite sheet 1000 may include at least one selected from first, second and third adhesive layers, and the third adhesive layer may be interposed between the second heat dissipation sheet and the display panel 1100. Due to the third adhesive layer, the composite sheet 1000 and the display panel 1100 may be bonded or attached together.

The second heat dissipation sheet of the composite sheet 1000 may include one or more perforations. Due to the perforations, bubbles that may be generated in the third adhesive layer may be easily released from the third adhesive layer to the outside of the composite sheet 1000. Accordingly, the stability of the bonding between the display panel 1100 and the composite sheet 1000 (e.g., by way of the third adhesive layer and the second heat dissipation sheet) may be improved.

While the invention has been shown and described with reference to exemplary embodiments thereof, it will be understood by those of ordinary skill in the art that various changes in form and detail may be made herein without departing from the spirit and scope of the invention as defined by the following claims, and equivalents thereof. The exemplary embodiments should be considered in a descriptive sense only and not for purposes of limitation.

What is claimed is:

1. A composite sheet comprising:
    a shock mitigating layer comprising an elastic member and a graphite layer accommodated in a receiving aperture of the elastic member;
    a first heat dissipation sheet attached to one surface of the shock mitigating layer;
    a second heat dissipation sheet attached to another surface of the shock mitigating layer, and
    a cover layer on the graphite layer and in the receiving aperture.

2. The composite sheet of claim 1, wherein the receiving aperture is at one side of the shock mitigating layer.

3. The composite sheet of claim 1, wherein at least one selected from the first heat dissipation sheet and the second heat dissipation sheet comprises a metallic material.

4. The composite sheet of claim 1, further comprising:
    a first adhesive layer between the first heat dissipation sheet and the shock mitigating layer,
    wherein the first adhesive layer comprises a conductive adhesive.

5. The composite sheet of claim 4, further comprising:
    a second adhesive layer between the second heat dissipation sheet and the shock mitigating layer,
    wherein the second adhesive layer comprises a conductive adhesive.

6. The composite sheet of claim 5, wherein the graphite layer is sealed inside the elastic member by being between the cover layer and the second adhesive layer.

7. The composite sheet of claim 5, further comprising:
a third adhesive layer on a surface of the second heat dissipation sheet on which the second adhesive layer is not located,
wherein the third adhesive layer comprises a conductive adhesive.

8. The composite sheet of claim 1, wherein the elastic member comprises a molded product comprising a foam material.

9. The composite sheet of claim 1, wherein the second heat dissipation sheet includes one or more perforations.

10. A display device comprising:
a display panel; and
a composite sheet attached to a surface of the display panel,
wherein the composite sheet comprises a shock mitigating layer comprising an elastic member and a graphite layer accommodated in receiving aperture of the elastic member, a first heat dissipation sheet attached to one surface of the shock mitigating layer, a second heat dissipation sheet attached to another surface of the shock mitigating layer, and a cover layer on the graphite layer and in the receiving aperture.

11. The display device of claim 10, wherein the display panel comprises a driving region comprising a driving unit capable of driving the display panel and the receiving aperture of the shock mitigating layer overlaps the driving region.

12. The display device of claim 10, wherein the composite sheet includes at least one selected from:
a first adhesive layer between the first heat dissipation sheet and the shock mitigating layer;
a second adhesive layer between the second heat dissipation sheet and the shock mitigating layer; and
a third adhesive layer between the second heat dissipation sheet and the display panel.

13. The display device of claim 12, wherein the composite sheet and the display panel are bonded together by the third adhesive layer.

14. The display device of claim 12, wherein the second heat dissipation sheet includes one or more perforations.

15. The display device of claim 12, wherein the graphite layer is sealed inside the elastic member by being between the cover layer and the second adhesive layer.

16. The display device of claim 12, wherein at least one selected from the first adhesive layer, the second adhesive layer and the third adhesive layer comprises a conductive adhesive and at least one selected from the first heat dissipation sheet and the second heat dissipation sheet comprises a metallic material.

17. The display device of claim 10, wherein the elastic member comprises a molded product comprising a foam material.

* * * * *